US009604309B2

(12) United States Patent
Kuge et al.

(10) Patent No.: US 9,604,309 B2
(45) Date of Patent: Mar. 28, 2017

(54) OPTICAL SCANNING DEVICE AND LASER MACHINING DEVICE HAVING PLURALITIES OF FLAT REFLECTIVE SURFACES CORRESPONDING TO DIVIDED VIRTUAL ARCS

(75) Inventors: Morimasa Kuge, Kobe (JP); Hideyuki Tanaka, Kobe (JP); Mutsuhiro Nakazawa, Kobe (JP); Kazunori Takahara, Kobe (JP); Osami Oogushi, Kobe (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 117 days.

(21) Appl. No.: 14/004,037

(22) PCT Filed: Mar. 8, 2012

(86) PCT No.: PCT/JP2012/001610
§ 371 (c)(1),
(2), (4) Date: Oct. 2, 2013

(87) PCT Pub. No.: WO2012/120892
PCT Pub. Date: Sep. 13, 2012

(65) Prior Publication Data
US 2014/0036331 A1 Feb. 6, 2014

(30) Foreign Application Priority Data

Mar. 8, 2011 (JP) ................................. 2011-050385

(51) Int. Cl.
*G02B 26/12* (2006.01)
*B23K 26/04* (2014.01)
(Continued)

(52) U.S. Cl.
CPC ........ *B23K 26/043* (2013.01); *B23K 26/0063* (2013.01); *B23K 26/083* (2013.01);
(Continued)

(58) Field of Classification Search
None
See application file for complete search history.

(56) References Cited

U.S. PATENT DOCUMENTS 4,190,759 A * 2/1980 Hongo et al. ............ 219/121.68
5,751,464 A * 5/1998 Yoshikawa et al. ....... 359/208.1
(Continued)

FOREIGN PATENT DOCUMENTS

| GB | 1 478 928 A | 7/1977 |
| JP | A-1-200220 | 8/1989 |

(Continued)

OTHER PUBLICATIONS

International Search Report issued in International Patent Application No. PCT/JP2012/001610 mailed Jun. 19, 2012.
(Continued)

*Primary Examiner* — Stephone B Allen
*Assistant Examiner* — Ryan S Dunning
(74) *Attorney, Agent, or Firm* — Oliff PLC

(57) ABSTRACT

An optical scanning device includes: a light projector configured to radiate light while causing the light to make angular movement at a constant speed; and a light reflector configured to reflect the light radiated from the light projector to guide the light to an intended irradiated point on a predetermined scanning line. The light reflector includes a plurality of reflecting portions and reflects, at least twice, the light radiated from the light projector to guide the light to the intended irradiated point. The reflecting portions each include a plurality of reflecting surfaces. A length of an optical path from the light projector to the irradiated point is substantially constant for all of irradiated points on the scanning line, and a scanning speed, on the scanning line, of the light radiated from the light projector is substantially constant.

12 Claims, 9 Drawing Sheets

(51) Int. Cl.
  *B23K 26/00* (2014.01)
  *G02B 26/10* (2006.01)
  *H01L 31/18* (2006.01)
  *B23K 26/08* (2014.01)
  *H01L 31/0463* (2014.01)

(52) U.S. Cl.
  CPC .......... *B23K 26/0821* (2015.10); *G02B 26/10* (2013.01); *G02B 26/12* (2013.01); *H01L 31/0463* (2014.12); *H01L 31/18* (2013.01); *G02B 26/125* (2013.01); *G02B 2207/117* (2013.01); *Y02E 10/50* (2013.01)

(56) References Cited

U.S. PATENT DOCUMENTS

| | | | |
|---|---|---|---|
| 5,975,417 A * | 11/1999 | Spencer | G06K 7/10693 235/462.36 |
| 6,046,835 A | 4/2000 | Yamawaki et al. | |
| 2002/0118428 A1 | 8/2002 | Ohno et al. | |
| 2003/0112485 A1 * | 6/2003 | Nishihata et al. | 359/208 |
| 2005/0056627 A1 * | 3/2005 | Gross et al. | 219/121.77 |
| 2005/0127046 A1 | 6/2005 | Grassmel et al. | |
| 2005/0269298 A1 * | 12/2005 | Hotta et al. | 219/121.8 |
| 2006/0138102 A1 * | 6/2006 | Sawada et al. | 219/121.69 |
| 2007/0056941 A1 * | 3/2007 | Murase et al. | 219/121.84 |

FOREIGN PATENT DOCUMENTS

| | | |
|---|---|---|
| JP | A-2004-170455 | 6/2004 |
| JP | B1-4231538 | 3/2009 |
| JP | A-2010-75996 | 4/2010 |
| JP | A-2010-221274 | 10/2010 |
| JP | A-2011-625 | 1/2011 |
| WO | 2010/091466 A1 | 8/2010 |

OTHER PUBLICATIONS

Search Report issued in Taiwanese Patent Application No. 101108014 dated Mar. 4, 2014.
Jul. 27, 2015 Search Report issued in European Patent Application No. 12754585.3.
Jul. 26, 2016 Office Action issued in European Application No. 127545853.

* cited by examiner

OPTICAL SCANNING DEVICE AND LASER MACHINING DEVICE HAVING PLURALITIES OF FLAT REFLECTIVE SURFACES CORRESPONDING TO DIVIDED VIRTUAL ARCS

TECHNICAL FIELD

The present invention relates to an optical scanning device configured to scan light such as a laser beam along a scanning line, and to a laser machining device including such an optical scanning device.

BACKGROUND ART

Technology for scanning a laser beam along a linear scanning line is widely used in laser printers, facsimile machines, laser machining devices, etc. For example, there are known solar cells for solar power generation such as thin-film solar cells and flexible solar cells (hereinafter, for the sake of convenience, these solar cells are collectively referred to as "thin film type solar cells"), and in the production process of such a thin film type solar cell, a laser machining device is used to perform patterning with a laser beam on work that is a substrate having a semiconductor film such as a metal film or silicon film formed on its one surface. Examples of the substrate of the work include a rectangular glass substrate having a predetermined length and a flexible substrate used in a roll-to-roll process. In the patterning using such a laser machining device, a laser beam is scanned along a scanning line set on work, such that a thin-film layer is partially removed from the work along the scanning line, and thereby a machining line is formed. The thin-film layer that is left after the patterning is performed forms a thin film type solar cell. It should be noted that, generally speaking, a pulse laser beam is applied as the laser beam of laser machining devices for use in patterning in consideration of for example, ease of micromachining and a thermal influence reduction effect. In a case where a pulse laser beam is applied as the laser beam, the pulse laser beam is scanned such that the radiation range of the laser beam oscillated at one timing partially overlaps, on the work, with the radiation range of the laser beam oscillated one pulse width prior to the laser beam oscillated at the one timing. In this manner, the continuity of the machining line is assured. It should be noted that an area where the radiation ranges of respective laser beams of adjoining two pulses overlap with each other may be referred to as an "overlap margin".

As described above, an optical scanning device configured to scan a laser beam is applied to laser machining devices, laser printers, and the like. Basically, such an optical scanning device is configured to: cause laser light emitted from a light source such as a laser oscillator to make angular movement by means of a deflector such as a polygon mirror or a galvano mirror; and irradiates an irradiated surface with a beam of the laser light that is making the angular movement. As a result, the laser beam is linearly scanned on the irradiated surface. Generally speaking, in order to obtain high operational reliability, the deflector is driven at a constant speed. This consequently allows the laser light to make the angular movement at a constant speed. However, if a laser beam is scanned along a linear scanning line with such a configuration, there occurs a difference in terms of laser beam scanning speed between the vicinity of the ends of the scanning line and a middle portion of the scanning line. In a laser machining device, such a scanning speed difference results in variation in size among overlap margins. Such variation in size among overlap margins causes uneven machining. A well-known optical element that eliminates the difference is an fθ lens. However, designing an fθ lens requires highly technical know-how. In addition, the size of equipment and tools for use in producing an fθ lens is limited, which makes it difficult to increase the size of the fθ lens. In view of these, conventionally, various optical elements to be used instead of an fθ lens for realizing both constant-speed deflector operation and constant-speed laser light scanning have been developed.

For example, Patent Literature 1 discloses a spherical mirror as an optical element to be included, instead of an fθ lens, in an optical scanning device for use in a laser printer or a facsimile machine. A laser beam from a deflector reflects on the spherical mirror and then concentrates on a photoreceptor surface. Through the application of the spherical mirror, the scanning speed of the laser beam is corrected such that the scanning speed becomes even in the extending direction of a scanning line, and such that favorable distortion characteristics and favorable image surface flatness are obtained over a wide angle of view on the light-concentrating surface.

Meanwhile, the unevenness of the machining by a laser machining device can be suppressed effectively if the laser machining device is configured such that the laser beam can be focused on any position on a scanning line, and such that the laser beam is incident on work as perpendicularly as possible. As mentioned above, in reality, it is difficult to apply an fθ lens to laser machining devices. In view of this, Patent Literature 2 discloses a plurality of mirrors arranged in a manner to form a substantially paraboloidal surface. The plurality of mirrors which serve as optical elements are included, instead of an fθ lens, in an optical scanning device for use in a laser machining device. A laser beam from a deflector reflects on the mirrors and then falls on work. Through the application of the mirrors thus arranged, the laser beam is incident on the work as perpendicularly as possible regardless of a rotation angle of the deflector. In addition, regardless of the rotation angle of the deflector, the length of an optical path from a deflection center to the work can be made as constant as possible, and the laser beam can be continuously focused on the work during the scanning.

CITATION LIST

Patent Literature

PTL 1: Japanese Laid-Open Patent Application Publication No. 1-200220

PTL 2: Japanese Laid-Open Patent Application Publication No. 2011-000625

SUMMARY OF INVENTION

Technical Problem

However, it is difficult to increase the size of the optical scanning device disclosed in Patent Literature 1 since the spherical mirror has a continuous surface. For this reason, it is difficult to apply the optical scanning device disclosed in Patent Literature 1 to cases where the scanning range of the laser beam is relatively wide, such as the case of a laser machining device.

Meanwhile, in the laser machining device disclosed in Patent Literature 2, a plurality of mirrors are arranged side by side. For this reason, the laser machining device disclosed in Patent Literature 2 has more freedom in terms of the device size than Patent Literature 1. However, the laser machining device disclosed in Patent Literature 2 is unable to eliminate the aforementioned difference in the laser beam scanning speed, the difference occurring in the case where the operation speed of the deflector is set to be constant. In order to suppress the occurrence of such a scanning speed difference in the laser machining device, there is no other way but driving the deflector at a variable speed. Thus, it is difficult to assure the operational reliability of the laser machining device.

In view of the above, an object of the present invention is to scan a laser beam at a constant speed while maintaining the laser beam in a focused state and performing a deflecting operation at a constant speed, and to make it possible to readily produce and increase the size of an optical scanning device configured to scan such light as a laser beam.

Solution to Problem

The present invention has been made to achieve the above object. An optical scanning device according to the present invention includes: a light projector configured to radiate light while causing the light to make angular movement at a constant speed; and a light reflector configured to reflect the light radiated from the light projector to guide the light to an intended irradiated point on a predetermined scanning line. The light reflector includes a plurality of reflecting portions and reflects, at least twice, the light radiated from the light projector to guide the light to the intended irradiated point. The reflecting portions each include a plurality of reflecting surfaces. A length of an optical path from the light projector to the irradiated point is substantially constant for all of irradiated points on the scanning line, and a scanning speed, on the scanning line, of the light radiated from the light projector is substantially constant.

According to the above configuration, the light projector radiates the light while causing the light to make angular movement at a constant speed. Accordingly, a light deflecting operation can be simplified. The length of the optical path from the light projector to the irradiated point is substantially constant for all of the irradiated points on the scanning line. Also, the scanning speed, on the scanning line, of the light radiated from the light projector is substantially constant. Therefore, regardless of a deflection angle of the light, a laser beam can be moved at a constant speed while maintaining the laser beam in a focused state. The light reflector includes the plurality of reflecting portions and reflects, at least twice, the light radiated from the light projector to guide the light to the intended irradiated point, and the reflecting portions each include a plurality of reflecting surfaces. This makes it possible to readily produce and increase the size of the light reflector, and realize the above-described functional advantages.

At least one of the reflecting surfaces may be a flat surface. According to the above configuration, the light reflector can be produced more easily.

The light projector may include a rotating multifaceted mirror configured to rotate at a constant speed. This configuration makes it possible to radiate the light while causing the light to make angular movement at a constant speed.

The rotating multifaceted mirror may include seven or more reflecting surfaces. This configuration makes it possible to radiate the light while causing the light to make angular movement at a constant speed, and realize the above-described functions.

The scanning line may be a straight line. The light projector may radiate a pulse laser beam. The optical scanning device may further include a cylindrical lens configured to flatten the pulse laser beam.

A laser machining device according to the present invention includes the above-described optical scanning device, and is configured to form a machining line with a laser beam in a thin-film layer formed on work.

The above configuration makes it possible to maintain the laser beam in a focused state and move the work at a speed that is made as constant as possible while simplifying the deflecting operation.

The laser machining device may include: a feeder configured to feed the work in a single feeding direction at a constant feeding speed; a work position maintaining mechanism configured to support the work at a proper position in a machining part configured to form the machining line in the work with the laser beam; and a controller configured to control the optical scanning device and the feeder. The optical scanning device may radiate a laser beam to the work fed by the feeder, the laser beam being radiated in a direction crossing the feeding direction. The controller may cause the optical scanning device to scan a single laser beam in the direction crossing the feeding direction of the work while causing the feeder to feed the work at the feeding speed or while causing the feeder to feed the work at the same time as detecting a feeding speed of the work, and may control the feeding speed of the work in relation to a scanning speed of the single laser beam such that a machining line formed by the single laser beam is perpendicular to the feeding direction of the work fed at the predetermined feeding speed.

According to the above configuration, while the work supported at the proper position is being fed, the optical scanning device scans a single laser beam on the work, and thereby a machining line perpendicular to the feeding direction of the work can be formed in the thin-film layer. Accordingly, the machining line can be formed in the thin-film layer on the work through patterning, by causing the laser beam to pass across the work once at a high-speed. Thus, the machining can be performed efficiently. Here, a laser beam scanning timing adjustment method may be adopted, in which the speed of the work is detected and feedback control is performed. Adopting such an adjustment method makes it possible to accommodate to a process in which the work flows in a continuous manner, such as a roll-to-roll process. As a result, a takt time in a solar cell production process can be reduced, which makes it possible to improve the production efficiency.

The constant-speed feeder may have a twisting correction function of adjusting a planar-direction relative angle between the work fed in the single feeding direction and the laser beam.

According to the above configuration, the machining can be performed while adjusting the planar-direction relative angle between the work and the laser beam so as to suppress twisting of the work.

The laser beam may be a flat beam that is long in a scanning direction.

According to the above configuration, a machining line can be formed at a high speed by scanning a single flat beam at a high speed. Accordingly, the takt time can be further reduced and thereby the production efficiency can be improved.

The work may be a glass substrate having a thin-film layer formed thereon, and the laser beam may be a transmissive laser beam. The laser machining device may be configured to radiate the transmissive laser beam to the glass substrate from an opposite side to the thin-film layer side to form a machining line in the thin-film layer.

According to the above configuration, a micro-explosion effect is caused on the thin-film layer at the opposite side to the side irradiated with the laser beam from the optical scanning device. This makes it possible to form a machining line with low output and improve machining efficiency.

The work position maintaining mechanism may include: a work supporting mechanism provided below the work and configured to feed the work with the thin-film layer facing upward; and a non-contact work pushing mechanism provided above the work.

According to the above configuration, a structure that comes into contact with the thin-film layer when the work is fed is eliminated, which makes it possible to prevent damage to the thin-film layer of the work.

The laser machining device may include a removed film suction device disposed at the thin-film layer side of the work.

According to the above configuration, a film removed by the laser beam is sucked up by the suction device, and thereby the film removed by the laser beam can be prevented from being adhered to the thin-film layer again.

Advantageous Effects of Invention

As is clear from the above description, the present invention makes it possible to scan a laser beam at a constant speed while maintaining the laser beam in a focused state and performing a deflecting operation at a constant speed, and to readily produce and increase the size of an optical scanning device configured to scan such light as a laser beam.

DESCRIPTION OF EMBODIMENTS

Figure 1:
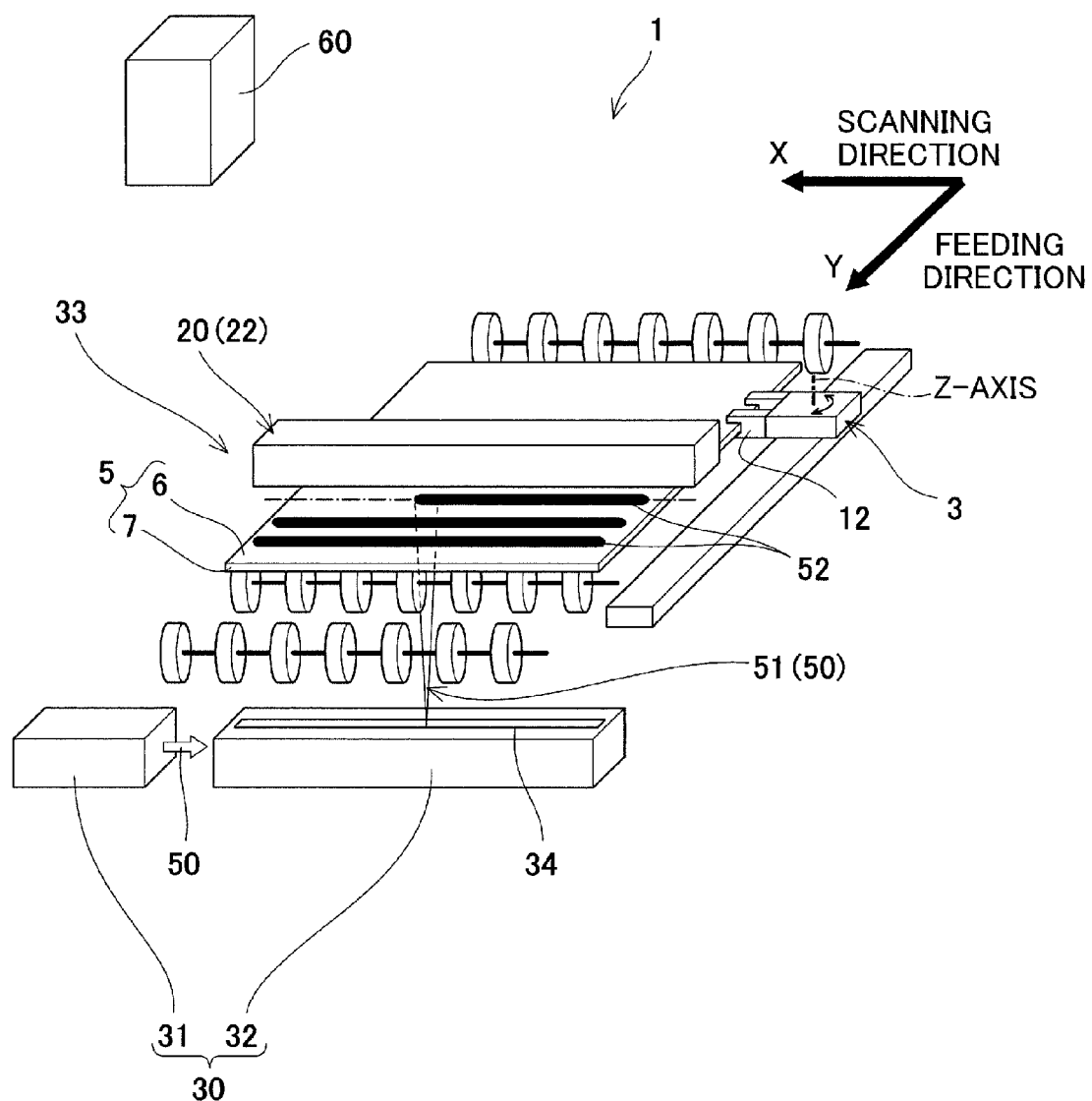
FIG. 1 is a perspective view schematically showing a laser machining device according to one embodiment of the present invention.

Hereinafter, one embodiment of the present invention will be described with reference to the accompanying drawings. In the drawings, the same or corresponding elements are denoted by the same reference signs, and a repetition of the same detailed description is avoided. In the description below, a laser machining device 1 is used in patterning during production of a thin film type solar cell. The description below shows, as an example, a case where work 5 is an intermediate product of the thin film type solar cell. The work 5 is a result of forming a thin film layer 6 on a substrate 7.

[Overall Configuration of Laser Machining Device]

FIG. 1 is a perspective view schematically showing the laser machining device 1 according to the embodiment of the present invention. As shown in FIG. 1, the laser machining device 1 includes: a feeder 3; a laser beam unit 30; and a controller 60.

The feeder 3 supports the work 5, such that the work 5 is in a horizontal orientation in which the thin film layer 6 faces upward, and feeds the work 5 at a constant speed in a feeding direction Y which is a horizontal direction. It should be noted that the longitudinal direction of the work 5 is parallel to the feeding direction Y, and the width direction of the work 5 is a horizontal direction perpendicular to the feeding direction Y. The feeder 3 includes a work holder 12 configured to correct the orientation of the work 5 around a Z-axis extending in the vertical direction. Through such operation of the work holder 12, a planar-direction relative angle between the width direction of the work 5 and a scanning line of a laser beam 50 is adjusted, and thereby consistency between the longitudinal direction of the work 5 and the feeding direction Y can be assured.

The laser beam unit 30 includes a laser oscillator 31 and a beam scanning unit 32. The laser oscillator 31 successively oscillates a pulse laser beam at a constant frequency in the range of kHz to MHz, and successively emits the oscillated pulse laser beam to the beam scanning unit 32. The beam scanning unit 32 radiates the laser beam 50 received from the laser oscillator 31 to the work 5 while deflecting the laser beam 50. As a result, the laser beam 50 is scanned on the work 5 in a direction crossing the feeding direction Y.

The laser beam 50 incident on the work 5 is transmitted through the substrate 7 and focuses at the thin film layer 6. In the present embodiment, the thin film layer 6 faces upward. Accordingly, the beam scanning unit 32 is disposed below the feeder 3, and the laser beam 50 passes through a beam radiation hole 34 of the beam scanning unit 32 upward. Then, the laser beam 50 is incident on the work 5 from below. When the laser beam 50 is scanned on the work 5, the thin film layer 6 comes off along the scanning line of the laser beam 50, and thereby a linear groove (hereinafter, referred to as a "machining line 52") is formed in the thin film layer 6. The scanning line of the laser beam 50 extends linearly in the width direction of the work 5, and also, the machining line 52 is formed in a manner to extend in the width direction of the work 5. A plurality of such machining lines are formed in the work 5, such that the machining lines are arranged to be spaced apart from each other in the longitudinal direction of the work 5.

In the laser machining device 1, a machining part 33 is provided such that, in the feeding direction Y, the machining part 33 is disposed near the installation position of the beam scanning unit 32. The machining part 33 includes a work position maintaining mechanism 20. The work position maintaining mechanism 20 supports the work 5 at a proper position. To be more specific, at least near the installation position of the beam scanning unit 32 in the feeding direction Y, the work position maintaining mechanism 20 allows the work 5 to move in the feeding direction Y but restricts the position of the work 5 in the vertical direction. In this manner, the focal point of the laser beam 50 can be prevented from being displaced from a desired position in the vertical direction (the vertical direction roughly coincides with an optical path direction of the laser beam 50).

The controller 60 controls the feeder 3, the laser beam unit 30, the work holder 12, and the work position maintaining mechanism 20. The controller 60 controls the laser oscillator 31, such that the pulse laser beam is oscillated at a constant frequency while a single machining line is formed. The controller 60 controls the beam scanning unit 32, such that the laser beam 50 is scanned at a constant speed while a single machining line is formed.

The laser machining device 1 may form the machining line 52 while feeding the work 5, or may stop feeding the work 5 while forming the machining line 52. In the case of forming the machining line 52 while feeding the work 5, the controller 60 controls the feeder 3 such that the work 5 is continuously moved in the feeding direction Y at a constant or non-constant speed while a necessary number of machining lines 52 are formed.

Figure 2:
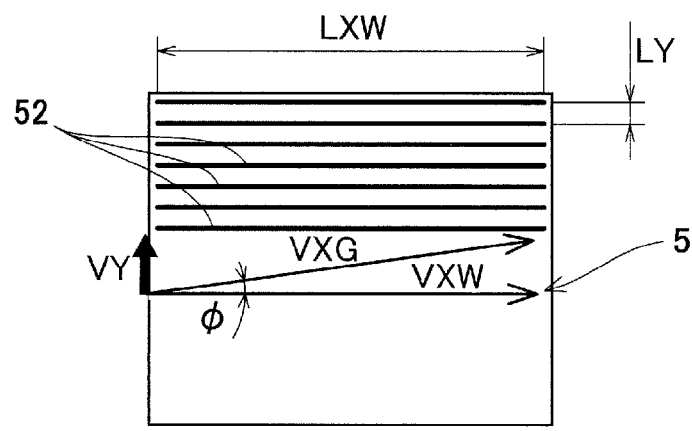
FIG. 2 is a conceptual diagram showing a laser beam scanning direction in the laser machining device shown in FIG. 1.
Figure 2:
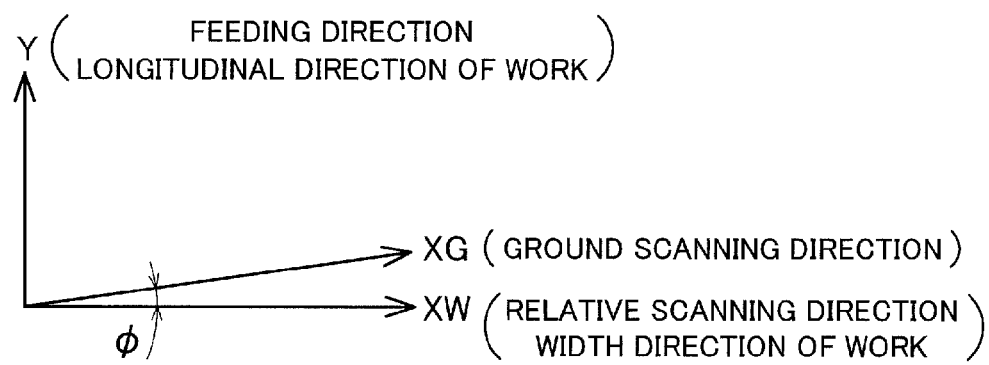

Hereinafter, the scanning direction of the laser beam 50 in the case of forming the machining line 52 while feeding the work 5 at a constant speed is briefly described with reference to FIG. 2. In this case, when seen from the work 5 being fed in the feeding direction Y, the scanning line of the laser beam 50 is required to linearly extend parallel to the width direction of the work 5. Meanwhile, the beam scanning unit 32 does not move in the feeding direction Y; the work 5 makes translational movement in the feeding direction Y at a constant speed; and the laser beam 50 is controlled to be scanned at a constant speed as described below. Accordingly, when seen from the ground where the beam scanning unit 32 is installed, the scanning line of the laser beam 50 is required to linearly extend in a horizontal direction that is inclined relative to both the longitudinal direction of the work 5 and the width direction of the work 5.

In the description below, in the case of clarifying the scanning direction of the laser beam 50 as the one seen from the ground, the scanning direction of the laser beam 50 is referred to as a "ground scanning direction XG", and in the case of clarifying the scanning direction of the laser beam 50 as the one seen from the work 5 being fed in the feeding direction Y, the scanning direction of the laser beam 50 is referred to as a "relative scanning direction XW". Similarly, in the case of clarifying the scanning speed of the laser beam 50 as the one seen from the ground, the scanning speed of the laser beam 50 is referred to as a "ground scanning speed VXG", and in the case of clarifying the scanning speed of the laser beam 50 as the one seen from the work 5 being fed in the feeding direction Y, the scanning speed of the laser beam 50 is referred to as a "relative scanning speed VXW". It should be noted that the relative scanning direction XW corresponds to the width direction of the work 5.

The relative scanning speed VXW corresponds to a synthetic rate of the ground scanning speed VXG in a horizontal plane and a feeding speed VY of the work 5. The relative scanning direction XW is perpendicular to the feeding direction Y. Here, an angle formed between the relative scanning direction XW in the horizontal plane and the ground scanning direction XG is referred to as an inclination angle φ. The sine of the inclination angle φ is obtained by dividing the feeding speed VY by the ground scanning speed VXG (sin φ=VY/VXG). The relative scanning speed VXW is obtained by multiplying the ground scanning speed VXG by the cosine of the inclination angle φ (VXW=VXG×cos φ).

It should be noted that, as will hereinafter be described, in the present embodiment, a polygon mirror continuously rotates in a single direction, and thereby the laser beam 50 is scanned. Assume here that one machining line 52 is formed as a result of the polygon mirror rotating from when the laser beam 50 is incident on one ridge portion of the polygon mirror to when the laser beam 50 is incident on the next ridge portion of the polygon mirror, and that the laser beam 50 radiated from the one ridge portion forms the start point of the one machining line 52 and the laser beam 50 radiated from the next ridge portion forms the end point of the one machining line 52. In this case, the tangent of the inclination angle φ is obtained by dividing a distance LY between machining lines 52 in the longitudinal direction of the work 5 by a length LXW of the machining line 52 in the width direction of the work 5 (tan φ=LY/LXW).

[Beam Scanning Unit]

Next, the configuration and functions of the beam scanning unit 32 applied to the above laser machining device 1 are described. It should be noted that, in the description below, a viewpoint is fixed on the work 5 for the purpose of generalizing the scanning direction of the laser beam 50 regardless of the manner of feeding the work 5. That is, in the description below, a term "scanning direction X" refers to the "relative scanning direction XW" unless otherwise specified; a term "scanning line" refers to a scanning line in the "relative scanning direction XW" unless otherwise specified; and a term "scanning speed VX" refers to the "relative scanning speed VXW" unless otherwise specified.

With use of the aforementioned equations (sin φ)=VY/VXG, VXW=VXG×cos φ, tan φ=LY/LXW), the description below based on the viewpoint on the work regarding a case where a machining line 52 is formed while the work 5 is continuously moved at a constant feeding speed VY can be converted into the description that is based on a viewpoint placed on the ground.

It should be noted that the above equations cannot be directly used if the feeding speed of the work 5 is not constant. In this case, however, the inclination angle and the ground scanning speed, both of which vary over time with the feeding speed, can be derived from the time. Accordingly, by using the inclination angle and the ground scanning speed derived from the time, the description below based on the viewpoint on the work can be converted into the description that is based on a viewpoint placed on the ground. In the case of forming a machining line while stopping the feeding of the work 5, the relative scanning direction coincides with the ground scanning direction, and the relative scanning speed coincides with the ground scanning speed.

Thus, the beam scanning unit 32, which will be described below, is suitably applicable to the laser machining device 1 configured to perform patterning on a thin film type solar cell regardless of the manner of feeding the work 5. It should be noted that the beam scanning unit 32 described below can be used also for patterning that is not intended for a thin film type solar cell. Moreover, the beam scanning unit 32 described below can be used also for laser scanning that is not intended for patterning.

Figure 3:
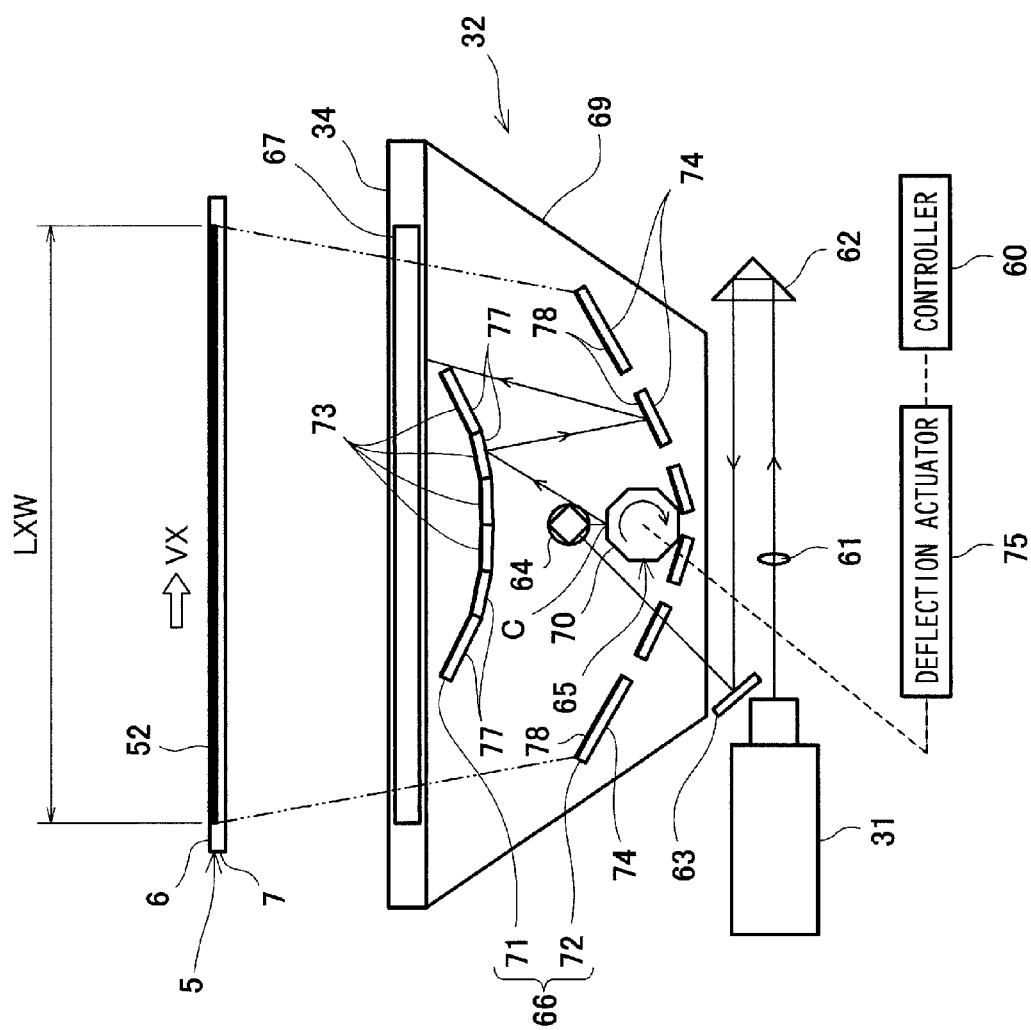
FIG. 3 is a conceptual diagram showing a brief configuration of a beam scanning unit shown in FIG. 1.

FIG. 3 is a conceptual diagram showing a configuration of the beam scanning unit 32. As shown in FIG. 3, the beam scanning unit 32 is an optical element or optical unit included in an optical system configured to scan the laser beam 50. The beam scanning unit 32 includes a beam oscillator 31, a lens 61, a prism 62, a first turn-around mirror 63, a second turn-around mirror 64, a light projector 65, a light reflector 66, and a cylindrical lens 67, which are sequentially arranged along an optical path of the laser beam 50 in said order starting from the beam oscillator 31. The beam scanning unit 32 includes a casing 69 accommodating a part of the above optical element or optical unit.

FIG. 3 shows an example where the casing 69 accommodates the second turn-around mirror 64, the light projector 65, the light reflector 66, and the cylindrical lens 67. However, this is merely an example. As an alternative, the casing 69 may accommodate the lens 61, the prism 62, and the first turn-around mirror 63, or the cylindrical lens 67 may be disposed outside the casing 69. It should be noted that the aforementioned beam radiation hole 34 is formed in the upper surface of the casing 69. The laser beam 50 is emitted upward from the inside to the outside of the casing 69 through the beam radiation hole 34.

The lens 61 is an optical element which allows the laser beam 50 generated by the laser oscillator 31 to focus at a focal point. The prism 62, the first turn-around mirror 63, and the second turn-around mirror 64 guide the laser beam 50 that has passed through the lens 61 to the light projector 65. These elements 62 to 64 form an optical unit on the optical path, and are positioned upstream from the light projector 65. The optical unit bends the optical path in order to obtain a necessary optical path length for allowing the laser beam 50 to focus on the work 5. These elements 62 to 64 may be eliminated as necessary. Moreover, an additional prism or mirror may be provided between the lens 61 and the light projector 65 as necessary.

When the laser beam 50 from the second turn-around mirror 64 is incident on the light projector 65, the light projector 65 radiates the laser beam 50 in a manner to cause the laser beam 50 to make angular movement at a constant speed. The light reflector 66 reflects the light radiated from the light projector 65 to guide the light to an intended irradiated point on a scanning line on the work 5. The movement of the light projector 65 causes the irradiated point to sequentially move in the scanning direction X along the scanning line on the work 5. The length of the optical path from the light projector 65 to the irradiated point is substantially constant for all of the irradiated points. Also, the scanning speed VX of the laser beam 50 radiated from the light projector 65 is substantially constant on the scanning line. Hereinafter, the light projector 65 and the light reflector 66, which are configured to realize these features, are described.

The light projector 65 according to the present embodiment includes a polygon mirror (rotating multifaceted mirror) 70 and a deflection actuator 75. The polygon mirror 70 is a deflector rotatably provided in the casing 69, and the rotational axis of the polygon mirror 70 is directed in a horizontal direction perpendicular to the scanning direction X. The deflection actuator 75 is an electric motor, for example. The deflection actuator 75 drives the polygon mirror 70 to rotate at a constant speed in a single direction. As a result, the laser beam 50 from the polygon mirror 70 makes angular movement at a constant speed. The operations of the deflection actuator 75 and the polygon mirror 70, and the deflection of the laser beam 50 caused by these operations, are controlled by the controller 60 (see FIG. 1).

The polygon mirror 70 is overall in the shape of a regular polygonal column. The polygon mirror 70 includes a plurality of reflecting surfaces provided on its respective sides. The laser beam 50 is incident on a side portion of the polygon mirror 70 when the polygon mirror 70 is rotating. The laser beam 50 reflects at a reflection angle corresponding to a rotational angular position of the polygon mirror 70 at the time. During a period from when the laser beam 50 reflects on one ridge portion of the polygon mirror 70 to when the laser beam 50 reflects on the next ridge portion, the polygon mirror 70 rotates by 360/N [deg] (N: the number of reflecting surfaces of the polygon mirror). Over the period, the laser beam 50 reflected by the polygon mirror 70 makes angular movement with respect to a point of reflection on the polygon mirror 70 (i.e., with respect to a deflection center) by an angle that is twice as large as the rotation angle of the polygon mirror 70 (i.e., by 720/N [deg]). It should be noted that the position of the deflection center is slightly moved in accordance with the rotation angle of the polygon mirror 70. However, in the description below, the movement of the deflection center in accordance with the rotation angle of the polygon mirror 70 is ignored. In other words, in the description herein, the definition of the term "deflection center" includes the entire range of the movement of the deflection center.

In the present embodiment, during the period from when the laser beam 50 reflects on one ridge portion of the polygon mirror 70 to when the laser beam 50 reflects on the next ridge portion (i.e., the period over which the laser beam 50 passes across a reflecting surface between the two ridge portions), the laser beam 50 is scanned on the work 5 along one scanning line. An irradiated point of the laser beam 50 reflected at the one ridge portion is the start point of the scanning line, and an irradiated point of the laser beam 50 reflected at the next ridge portion is the end point of the scanning line.

The beam scanning unit 32 according to the present embodiment does not include a device for varying the focal length of the laser beam 50 in accordance with the rotation angle of the polygon mirror 70 (but the optical scanning device according to the present invention may include such a device). If the light reflector 66 does not exist, the focal point of the laser beam 50 draws an arc trajectory. The center of the trajectory is the deflection center, and the radius of the trajectory is the length of the optical path from the deflection center to the focal point. Meanwhile, unlike the arc trajectory, a scanning line extends linearly in the scanning direction X. Accordingly, the distance from an irradiated point on the scanning line to the focal point varies in accordance with the position of the irradiated point (i.e., in accordance with the deflection angle of the laser beam 50 or the rotation angle of the polygon mirror 70). Therefore, the length of the optical path from the polygon mirror 70 to an irradiated point on the scanning line is not constant for all of the irradiated points, but varies in accordance with the position of the irradiated point. In addition, if the laser beam 50 makes angular movement at a constant speed, the scanning speed of the laser beam 50 on the scanning line is not constant.

In order to solve the above problems, the light reflector 66 reflects the laser beam 50 from the light projector 65 at least twice, thereby guiding the laser beam 50 to the work 5. The light reflector 66 includes a plurality of light reflecting portions such that the length of the optical path from the light projector 65 to an irradiated point on the scanning line on the work 5 is substantially constant for all of the irradiated points, and such that the scanning speed of the laser beam 50 is substantially constant even if the laser beam 50 makes angular movement at a constant speed.

The light reflector 66 according to the present embodiment includes a primary reflecting portion 71 and a secondary reflecting portion 72. The primary reflecting portion 71 reflects the laser beam 50 from the light projector 65 (polygon mirror 70). The secondary reflecting portion 72 further reflects the laser beam 50 from the primary reflecting portion 71. Thus, the laser beam 50 from the light projector 65 (polygon mirror 70) is reflected twice. In other words, as optical elements forming the optical system configured to scan the laser beam 50, the beam scanning unit 32 according to the present embodiment includes primary mirrors 73 serving as the primary reflecting portion 71 and secondary mirrors 74 serving as the secondary reflecting portion 72 between the polygon mirror 70 and the cylindrical lens 67. The light reflector 66 includes these primary mirrors 73 and secondary mirrors 74, which are fixed within the casing 69. It should be noted that the light reflector 66 may include three or more reflecting portions.

In the present embodiment, the light reflector 66 reflects the laser beam twice, and the laser beam 50 is incident on the work 5 from below. Accordingly, the laser beam 50 from the second turn-around mirror 64 is incident roughly downward on the polygon mirror 70. The polygon mirror 70 reflects the laser beam 50 incident thereon in a roughly upward direction. The primary mirrors 73 are arranged above the polygon mirror 70, and reflect the laser beam 50 from the polygon mirror 70 in a roughly downward direction. The secondary mirrors 74 are arranged below the primary mirrors 73, and reflect the laser beam 50 from the primary mirrors 73 in a roughly upward direction.

Figure 4:
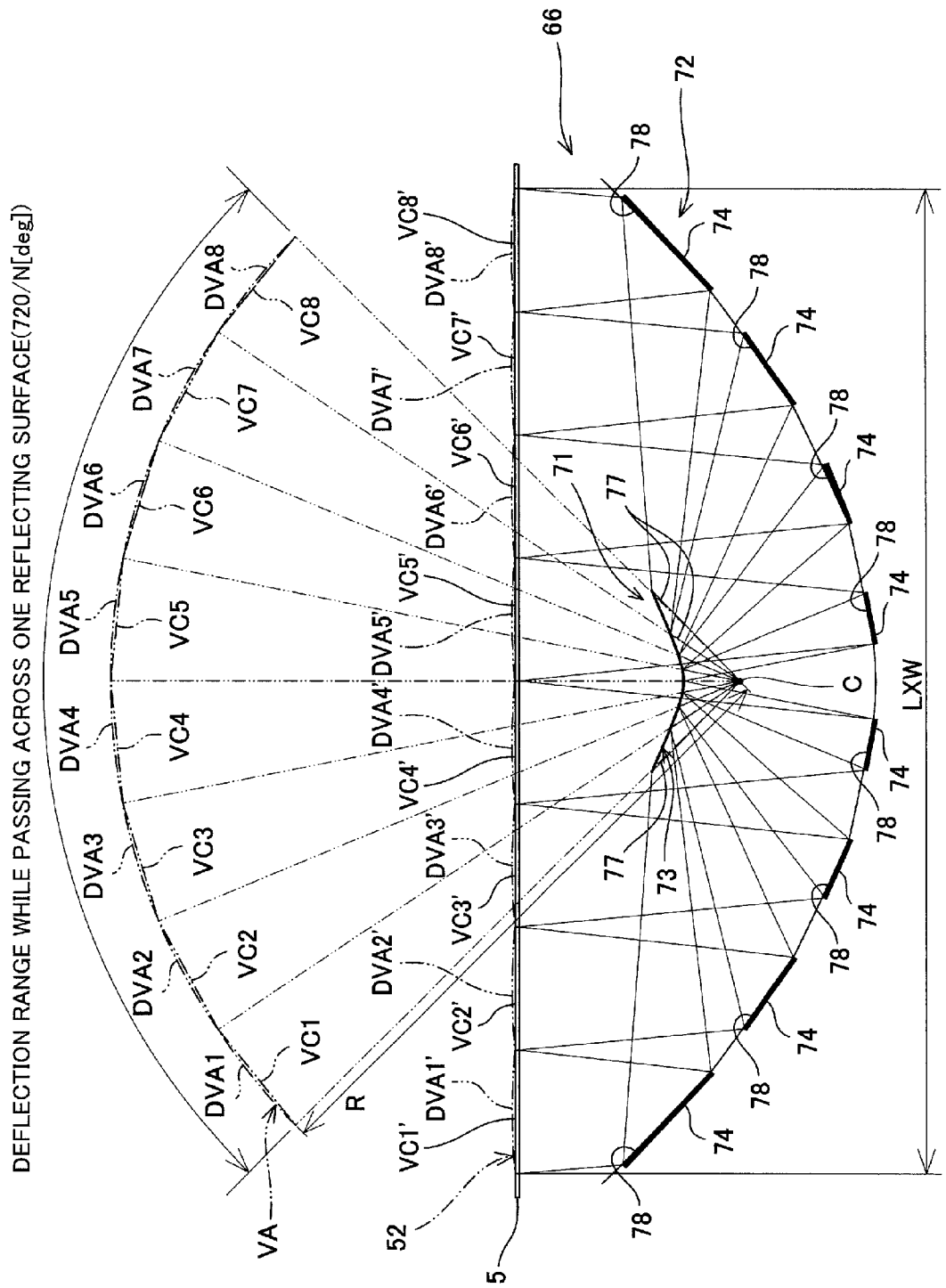
FIG. 4 is a conceptual diagram showing a positional relationship among a deflection center, primary reflecting surfaces, secondary reflecting surfaces, and a scanning line shown in FIG. 3.

FIG. 4 is a conceptual diagram showing a positional relationship among a deflection center C, the primary reflecting portion 71, the secondary reflecting portion 72, and a scanning line 52. As shown in FIG. 4, while the laser beam 50 passes across one reflecting surface of the polygon mirror 70, the laser beam 50 moves in the scanning direction X along one scanning line 52 on the work 5. If the primary mirrors 73 and the secondary mirrors 74 do not exist, the focal point of the laser beam 50 draws an arc VA with respect to the deflection center C (hereinafter, referred to as a "virtual arc VA"). The radius R of the virtual arc VA is the length of an optical path from the deflection center C to the focal point. The primary mirrors 73 and the secondary mirrors 74 bend the optical path from the deflection center C to the focal point, thereby rearranging the virtual arc VA such that the virtual arc VA linearly extends on the work 5 in the scanning direction X (the width direction of the work 5). In order to thus rearrange the virtual arc VA so that the virtual arc VA will coincide with the scanning line 52, the length of the virtual arc VA needs to be equal to the length of the scanning line 52. As described above, the length of the scanning line 52 corresponds to the length LXW of a machining line 52 in the width direction of the work 5. Hereinafter, these lengths are collectively referred to as a line length LXW.

If the number of reflecting surfaces of the polygon mirror 70 is N, the central angle of the virtual arc VA (i.e., the angular movement range of the laser beam 50) is 720/N [deg]. If the circular constant is π and the radius of the virtual arc VA is R, the length of the virtual arc VA is 2πR/{360×(N/720)}, which is equal to the line length LXW. Geometrically, the line length LXW cannot be longer than the diameter of the virtual arc VA. Based on the above, an inequality (1) below is obtained.

[Math. 1]

$$LXW = \frac{2\pi R}{360 \times \frac{N}{720}} \leq 2R \qquad (1)$$

$$N \geq 2\pi$$

It is understood from the inequality (1) that the polygon mirror 70 according to the present embodiment is required to have seven or more reflecting surfaces (N is an integer). However, preferably, the number of reflecting surfaces N is an even number. The reason for this is that if the number of reflecting surfaces N is an even number, the light reflector 66 (more specifically, the primary reflecting portion 71 and the secondary reflecting portion 72 in the present embodiment) can be readily arranged by using the vertical axis of FIG. 4 as an axis of symmetry. If the number of reflecting surfaces N increases, the rotation angle of the polygon mirror 70 and the size of the virtual arc VA both corresponding to one scanning line decrease, which makes it difficult to obtain a long line length LXW. For this reason, it is preferable for the polygon mirror 70 to have eight reflecting surfaces. FIG. 4 shows an example in which the number of reflecting surfaces of the polygon mirror 70 is eight, and the deflection range of the laser beam while passing across one reflecting surface is 90 degrees. However, the number of reflecting surfaces of the polygon mirror 70 need not be seven or more. For example, in a case where each reflecting surface is not fully used to deflect the laser beam 50, the number of reflecting surfaces of the polygon mirror 70 may be suitably set to six or less.

Hereinafter, a specific method of rearranging the virtual arc VA such that the virtual arc VA coincides with the scanning line 52 is described. First, the virtual arc VA is evenly divided into a plurality of divided virtual arcs DVA1, DVA2, . . . , and then, a plurality of virtual chords VC1, VC2, . . . corresponding to the plurality of respective divided virtual arcs DVA1, DVA2, . . . are obtained. Next, the plurality of virtual chords VC1, VC2, . . . are rearranged such that the plurality of virtual chords VC1, VC2, . . . are sequentially and linearly aligned in the scanning direction X on the work 5. As a result, a plurality of virtual chords VC1', VC2', . . . , which are thus rearranged on the work 5, form the scanning line 52.

By forming the scanning line 52 in this manner, both two end points of each of the divided virtual arcs DVA1, DVA2, . . . are rearranged on the scanning line 52, and each of the divided virtual arcs DVA1, DVA2, . . . (i.e., a curve connecting these two points) is rearranged to be curved to the downstream side from the scanning line 52 in the optical axis direction. The focal point makes angular movement along rearranged divided virtual arcs DVA1', DVA2', . . . , and similar to the rearranged virtual chords VC1', VC2', . . . , the rearranged divided virtual arcs DVA1', DVA2', . . . are sequentially continuous in the scanning direction X.

When the virtual arc VA is divided into the plurality of divided virtual arcs DVA1, DVA2, . . . , the divided virtual arcs DVA1, DVA2, . . . approximate well to the virtual chords VC1, VC2, . . . corresponding thereto. As a result, the length of the optical path from the deflection center C of the polygon mirror 70 to an irradiated point on the scanning line 52 becomes substantially constant for all of the focal points. Further, if the laser beam 50 makes angular movement at a constant speed, the focal point makes angular movement along the rearranged divided virtual arcs DVA1', DVA2', . . . at a constant speed. Since the divided virtual arcs DVA1', DVA2', . . . approximate well to the corresponding virtual chords VC1', VC2', . . . , the behavior of the focal point approximates well to constant-speed linear movement along the scanning line 52.

As described above, in the present embodiment, the light reflector 66 includes: the primary reflecting portion 71 configured to reflect the laser beam from the light projector 65; and the secondary reflecting portion 72 configured to further reflect the laser beam 50 from the primary reflecting portion 71. Thus, the light reflector 66 reflects the laser beam 50 from the light projector 65 at least twice. If it is assumed that the light reflector 66 is not absent, the focal point of the laser beam 50 radiated from the light projector 65 draws the virtual arc VA with respect to the deflection center C. However, the light reflector 66 reflects the laser beam 50 (at least) twice, thereby rearranging the plurality of virtual chords VC1, VC2, . . . , which correspond to the plurality of respective divided virtual arcs DVA1, DVA2, . . . obtained by dividing the virtual arc VA, such that these virtual chords become continuous on the work 5. The laser beam 50 guided to the work 5 is scanned along the scanning line 52 formed by the plurality of virtual chords VC1', VC2', . . . , which have been rearranged. This makes it possible to cause the laser beam 50 to move in the scanning direction X at a speed as constant as possible and cause the laser beam 50 to continuously focus on the work 5 as much as possible while simplifying the operation of the polygon mirror 70. This consequently makes it possible to improve the operational reliability of the beam scanning unit 32, improve the machining efficiency, and suppress the unevenness of the machining at the same time, and also, eliminate the necessity of using a special device for varying the focal length of the laser beam 50 in accordance with the rotation angle of the polygon mirror 70.

In accordance with an increase in the number of divided virtual arcs DVA1, DVA2, . . . , the distance between the middle point of each of the virtual chords VC1, VC2, . . . and the middle point of a corresponding one of the divided virtual arcs DVA1, DVA2, . . . decreases, and the proximity of the focal point to the virtual chords VC1, VC2, . . . increases, which makes it possible to keep the optical path length highly constant and to keep the speed of the movement of the laser beam 50 highly constant. The number of divided virtual arcs may be suitably determined in accordance with allowable errors of the beam scanning unit 32 and the laser machining device. For example, as shown in FIG. 4, in a case where the number of reflecting surfaces N of the polygon mirror 70 is eight, if the number of divided virtual arcs is eight (the central angle of each divided virtual arc is 11.25 degrees), then the discrepancy between the divided virtual arcs and the virtual chords (in terms of length) is 1.98%. In a case where the number of divided virtual arcs is increased compared to the case shown in FIG. 4, for example, if the number of divided virtual arcs is 16, (the central angle of each divided virtual arc is 5.625 degrees), then the aforementioned discrepancy is 0.63%, and if the number of divided virtual arcs is 36, (the central angle of each divided virtual arc is 2.5 degrees), then the aforementioned discrepancy is 0.10%.

In order to rearrange the virtual chords VC1, VC2, . . . on the work 5, sectors formed by the divided virtual arcs DVA1, DVA2, . . . corresponding to the virtual chords VC1, VC2, . . . may each be folded twice. As a result, two fold lines are formed in each sector. Of the two fold lines, one (the first) fold line corresponds to one of a plurality of reflecting surfaces 77 forming the primary reflecting portion 71, and the other (the second) fold line corresponds to one of a plurality of reflecting surfaces 78 forming the secondary reflecting portion 72. Each sector needs to be folded at least twice in order to rearrange the plurality of virtual chords VC1, VC2, . . . in a straight line. For this reason, the light reflector 66 includes a plurality of reflecting portions (in the present embodiment, the primary reflecting portion 71 and the secondary reflecting portion 72, i.e., two types of reflecting portions).

In order to allow the virtual chords VC1, VC2, . . . to be sequentially continuous, it is preferred that the first fold lines of adjoining sectors do not overlap with each other. That is, preferably, in the primary reflecting portion 71, the reflecting surface 77 that corresponds to one of the divided virtual arcs DVA1, DVA2, . . . and the reflecting surface 77 that corresponds to an adjacent one of the divided virtual arcs DVA1, DVA2, . . . do not overlap with each other. By satisfying this condition, the second fold lines (i.e., the reflecting surfaces 78 forming the secondary reflecting portion 72) can be arranged perpendicularly to the corresponding rearranged virtual chords VC1', VC2', and the scanning line 52. This makes it possible to allow the laser beam 50 reflected by the secondary reflecting portion 72 to be roughly perpendicularly incident on the work 5. Consequently, the machining efficiency is improved and the unevenness of the machining can be suppressed. In particular, preferably, ends of the first fold lines of adjoining sectors (i.e., ends of two adjoining reflecting surfaces of the plurality of reflecting surfaces 77 forming the primary reflecting portion 71) are continuous with each other. By adopting such a configuration, the overall primary reflecting portion 71 can be made as compact as possible.

It should be noted that even if the primary reflecting portion 71 is configured in the above manner, the second fold line of each sector is not continuous with its adjacent second fold lines. That is, two adjoining reflecting surfaces among the plurality of reflecting surfaces 78 forming the secondary reflecting portion 72 are not continuous with each other. However, the more the number of divided virtual arcs DVA1, DVA2, ..., the closer the ends of the second fold line of each sector are to the ends of its adjacent second fold lines.

In the present embodiment, the virtual chords VC1, VC2, ..., which are straight lines, are rearranged so as to extend along a straight line in the scanning direction X. Accordingly, the two fold lines may be both straight lines. That is, the reflecting surface 77 of the primary reflecting portion 71 and the reflecting surface 78 of the secondary reflecting portion 72 both corresponding to one virtual chord are flat surfaces. In particular, in the secondary reflecting portion 72, the reflecting surface 78 corresponding to one virtual chord is disposed away from the reflecting surfaces 78 corresponding to the adjacent virtual chords.

Figure 5A:
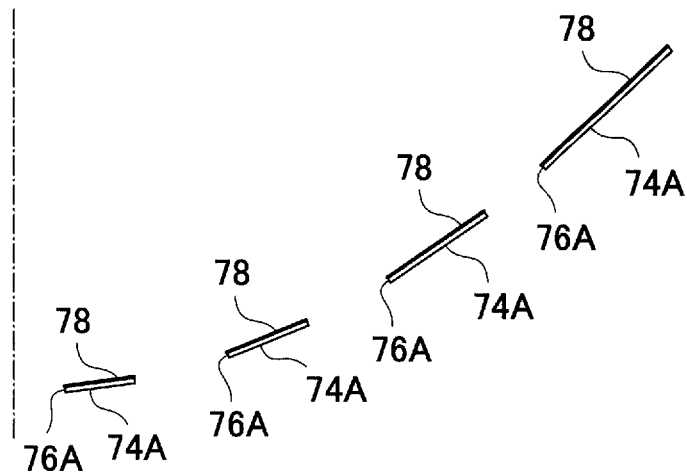
FIG. 5A is a partial side view showing a structure example of secondary mirrors shown in FIG. 3.
Figure 5B:
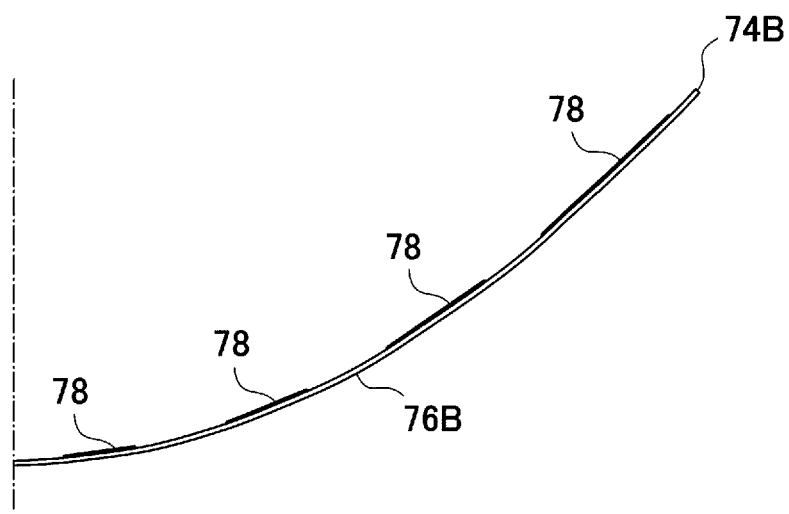
FIG. 5B is a partial side view showing a structure example of the secondary mirrors shown in FIG. 3.

FIG. 5A and FIG. 5B are partial side views showing structures of secondary mirrors 74A and 74B. The secondary mirrors 74 may have any structure, so long as the structure allows the reflecting surfaces 78 of the secondary reflecting portion 72 to be arranged in the above-described manner. For example, in FIG. 5A, the light reflector 66 includes a plurality of secondary mirrors 74A, which are arranged away from each other. The plurality of reflecting surfaces 78, which are obtained by folding the sectors, are each provided on a respective one of mirror bodies 76A of the secondary mirrors 74A. Alternatively, as in the case of a secondary mirror 74B shown in FIG. 5B, the plurality of reflecting surfaces 78 may be provided at necessary positions on a single mirror body 76B of the secondary mirror 74B, and thus integrated with the single mirror body 76B. Although FIGS. 5A and 5B show examples regarding the secondary mirrors 74, the same is true of the primary mirrors 73. Since the plurality of reflecting surfaces 77 and 78, which are arranged in a non-continuous manner, form the reflecting portions 71 and 72, the light reflector 66 can be readily produced and its size can be readily increased compared to a case where the light reflector is realized by a single mirror with a non-flat surface. In particular, in the present embodiment, all of the reflecting surfaces 77 and 78 are flat surfaces. This makes it possible to more readily produce the light reflector 66. However, not all of the reflecting surfaces are required to be flat surfaces.

Figure 6:
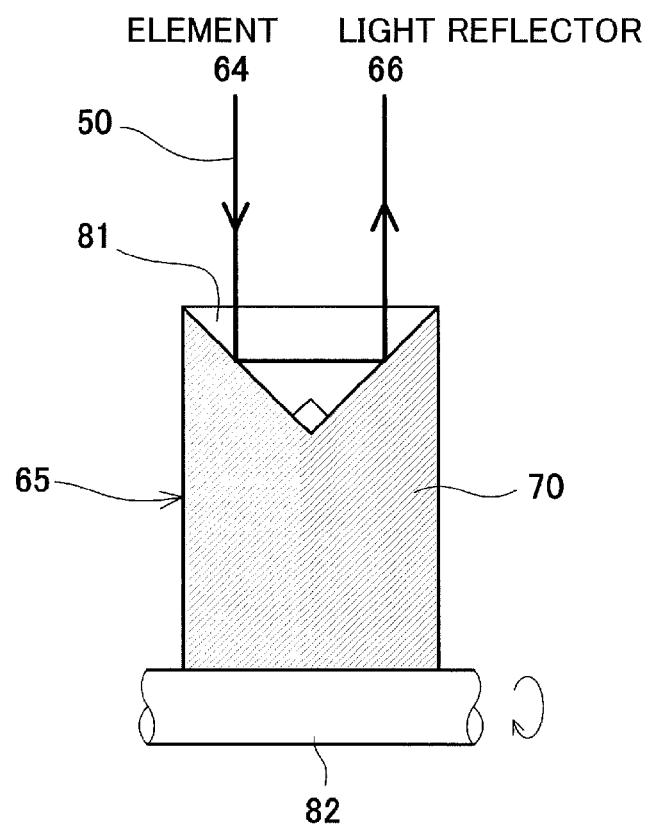
FIG. 6 is a fragmentary sectional view of a polygon mirror shown in FIG. 3.

FIG. 6 is a fragmentary sectional view of the polygon mirror 70. Referring to FIG. 3, the laser beam 50 is turned around up and down multiple times within the casing 69. Here, the elements 64, 70, 73, and 74 need to be arranged so that these elements will not interfere with the optical path. In this respect, as shown in FIG. 6, a 45-degree prism 81 is provided at the side of the polygon mirror 70. The 45-degree prism 81 is configured to emit the laser beam 50 incident thereon in a direction parallel to the incident direction, such that the optical path of the emitted beam is away from the optical path of the incident beam in the axial direction of a rotational axis 82 of the polygon mirror 70 (in FIG. 3, away in a direction perpendicular to the plane of the drawing). In this manner, the laser beam 50 emitted from the polygon mirror 70 can be guided to the primary reflecting portion 71 while preventing the laser beam 50 from interfering with the second turn-around mirror 64. In addition, it is not necessary for the optical path to be arranged on a plane that is inclined relative to the plane of FIG. 3. Thus, installation work of the optical element is simplified. The 45-degree prism may also be applied to the primary reflecting portion 71 and the secondary reflecting portion 72.

As previously described, the beam scanning unit 32 includes the cylindrical lens 67 as shown in FIG. 3. The cylindrical lens 67 flattens the laser beam 50 reflected by the secondary reflecting portion 72.

Figure 7:
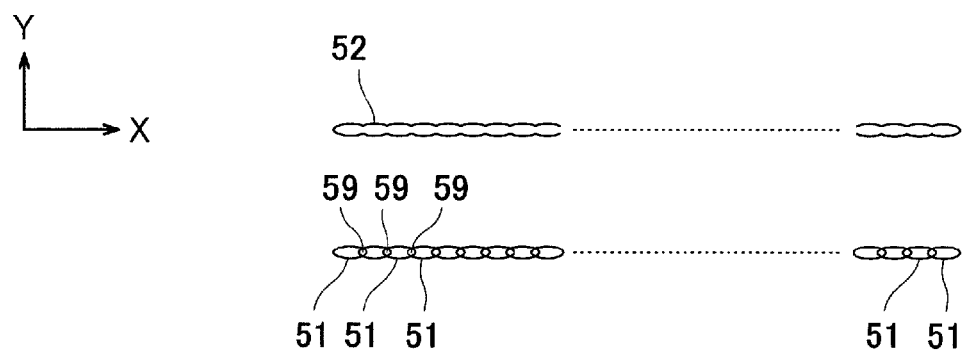
FIG. 7 is a conceptual diagram showing overlap margins of pulse laser beams radiated from the beam scanning unit shown in FIG. 3.

FIG. 7 is a conceptual diagram illustrating the formation of a machining line that is formed by using flattened pulse laser beams. The laser oscillator 31 according to the present embodiment generates a pulse laser beam. The pulse laser beam has a small-diameter round shape. Such a pulse laser beam 51, after having passed through the cylindrical lens 67, becomes long in the scanning direction and short in a direction perpendicular to the scanning direction, i.e., has an ellipsoidal flat shape. The radiation range of each flat pulse laser beam 51 partially overlaps with the radiation range of the pulse laser beam 51 oscillated one pulse width prior to the pulse laser beam 51. By radiating the pulse laser beams 51 in a manner to form such an overlap margin 59, the continuity of the machining line 52 can be assured even in a case where the pulse laser beam 51 is applied as the laser beam 50. Since the beam scanning unit 32 according to the present embodiment is capable of setting the scanning speed VX of the laser beam 50 to be substantially constant, variation in the size of each overlap margin 59 can be suppressed.

By using the flat pulse laser beam 51 in the above manner, the scanning speed can be increased, which is advantageous. Moreover, as compared to a case where the laser beam 51 is not flattened, a narrower machining line 52 with less irregularity in the longitudinal direction of the work 5 can be formed. It should be noted that in the case of forming the machining line 52 while feeding the work 5 and applying the flat pulse laser beam 51, the dimension of the flat pulse laser beam 51 in its longitudinal direction and the feeding speed VY of the work 5 are taken into consideration, and pulse laser beams 51 may be radiated in such a manner that the front ends of the respective pulse laser beams 51 are slightly displaced in the feeding direction Y in a step-like manner.

Although the beam scanning unit according to the embodiment of the present invention has been described above, the above configuration of the beam scanning unit may be changed as necessary. The light projector is not limited to a polygon mirror. For example, a different deflector such as a galvano mirror may be applied as the light projector. Moreover, the light reflector may include three or more reflecting portions.

[Other Configurations of Laser Machining Device]

Figure 8:
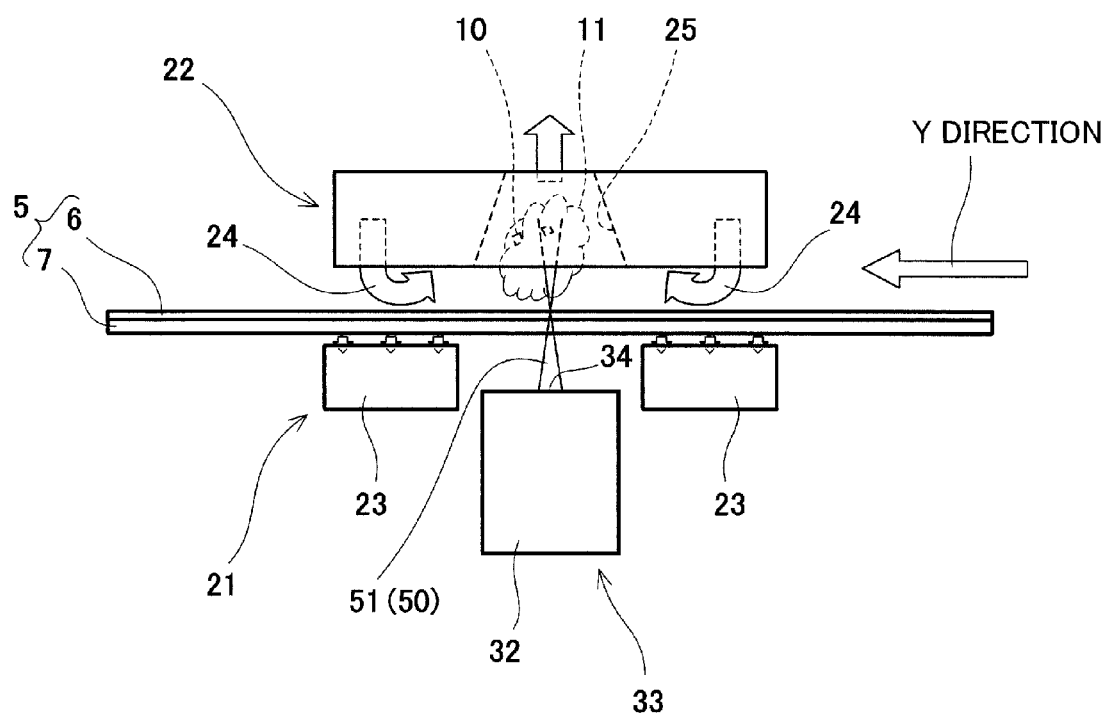
FIG. 8 is a side view schematically showing a machining part of the laser machining device shown in FIG. 1.
Figure 9:
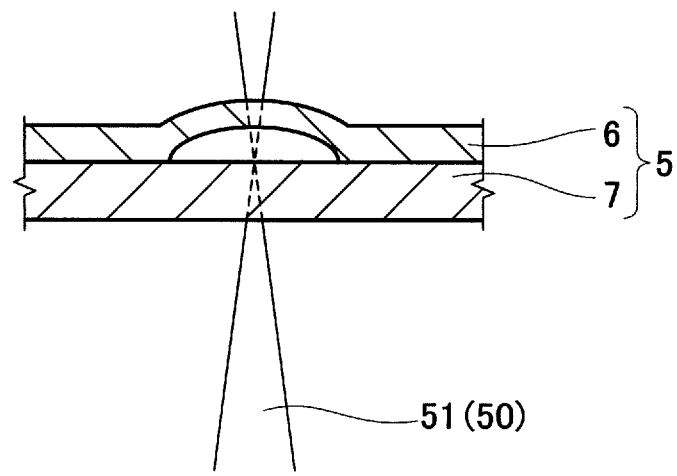
FIG. 9 is a partial side view schematically showing the machining part of FIG. 8 in an enlarged manner.
Figure 10:
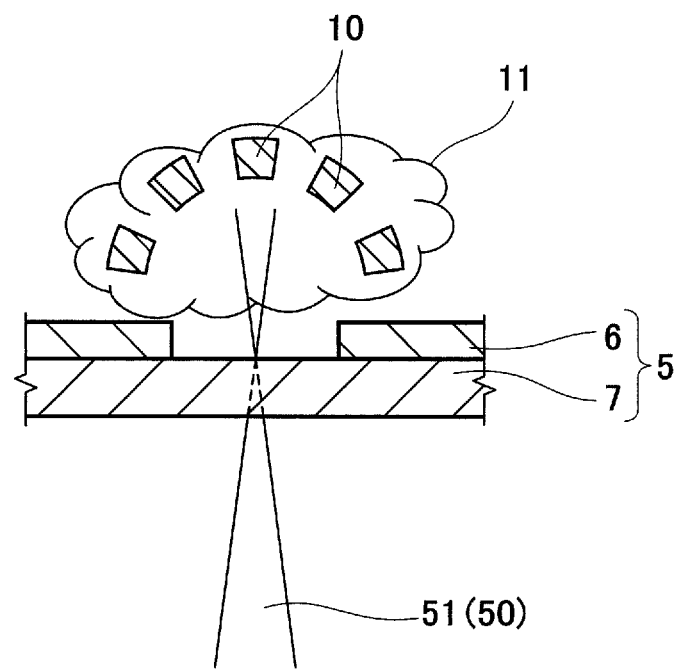
FIG. 10 is a partial side view showing a laser beam radiation function in the machining part shown in FIG. 8.

FIG. 8 is a side view schematically showing the machining part 33 shown in FIG. 1. FIG. 9 is a partial side view schematically showing the machining part 33 of FIG. 8 in an enlarged manner. FIG. 10 is a partial side view schematically showing a laser beam radiation function in the machining part 33 shown in FIG. 8.

As shown in FIG. 8, the work position maintaining mechanism 20 according to the present embodiment includes: a work supporting mechanism 21 disposed below the work 5 together with the beam scanning unit 32; and a work pushing mechanism 22 disposed above the work 5. That is, the beam scanning unit 32 and the work supporting mechanism 21 are provided at the lower part of the machining part 33, and the work pushing mechanism 22 is provided at the upper part of the machining part 33.

For example, rollers, free bearing, or a non-contact air suction unit (such as a drawing mechanism configured to draw the work 5 from below by means of air) is used as the work supporting mechanism 21. In this example, a non-contact air suction unit 23 is applied as the work supporting mechanism 21. The work 5 is sucked downward by the non-contact air suction unit 23 with a gap formed between the work 5 and the non-contact air suction unit 23 as shown in FIG. 8. This makes it possible to suppress variation in the vertical position (elevation) of the work 5 fed in the feeding direction Y at least at a laser beam irradiated portion of the work 5.

When the work 5 is fed, the work 5 is in such an orientation that the surface of the thin film layer 6 is positioned at the opposite side to the beam radiation hole 34 (i.e., the surface of the thin film layer 6 is the upper surface of the work 5). Accordingly, the laser beam 50 radiated from the beam radiation hole 34 is transmitted upward through the substrate 7 and focuses at the thin film layer 6.

As a result of the laser beam 50 focusing at the thin film layer 6 in such a manner, the thin film layer 6 is removed, and thus a machining line 52 is formed. Since the work 5 is irradiated with the laser beam 50 from the opposite side to the thin film layer 6 side, the substrate 7 is positioned between the optical system (e.g., the beam scanning unit 32) and a thin film 10 that has come off (see also FIG. 10) as well as vaporized materials 11 (see also FIG. 10). Thus, the substrate 7 serves to protect the optical system from the thin film 10 that has come off and the vaporized materials 11.

Meanwhile, for example, an air blower 24 configured to push the work 5 from above in a non-contacting manner or pressing rollers are used as the work pushing mechanism 22. In this example, the air blower 24 is applied as the work pushing mechanism 22. Since the machining part 33 includes the work supporting mechanism 21 and the work pushing mechanism 22, variation in the vertical position (elevation) of the work 5 fed in the feeding direction Y can be suppressed at least around the machining part 33. This makes it possible to suppress deviation of the focal point of the laser beam 50 from a desired position, thereby improving machining accuracy.

The machining part 33 further includes a suction duct 25 through which the thin film 10 that has come off and the vaporized materials 11 are sucked up. The suction duct 25 is provided at the opposite side to the beam scanning unit 32 with respect to the work 5. That is, the suction duct 25 is provided above the work 5 and at the upper part of the machining part 33. In the present embodiment, the suction duct 25 is integrated with the air blower 24 applied as the work pushing mechanism 22. This allows air from the air blower 24 to be readily sucked up through the suction duct 25. Therefore, after the thin film 10 that has come off is blown away by the air blower 24, the thin film 10 can be sucked up through the suction duct 25 more assuredly. At the time, the vaporized materials 11 can also be sucked up more assuredly. This makes it possible to suppress the thin film 10 that has come off and the vaporized materials 11 from being adhered to the thin film layer 6 again.

As shown in FIG. 9, the work 5 is a film-formed glass, which is formed such that the thin film layer 6 is formed on the substrate 7. While the work 5 is being fed in a state where the thin film layer 6 is the upper surface of the work 5, the work 5 is irradiated with the laser beam 50 from the opposite side to the thin film layer side. This causes a micro-explosion effect to occur between the substrate 7 and the thin film layer 6. By causing the micro-explosion effect, the machining line 52 is formed in the thin film layer 6 with low output, and thus machining efficiency is improved. Specifically, a portion between the thin film layer 6 and the substrate 7 is vaporized to come off due to the laser beam 50. Then, as shown in FIG. 10, a micro-explosion effect is caused to occur at the vaporized portion and thereby the thin film layer 6 comes off. In this manner, patterning can be efficiently performed on the thin film layer 6 at a high speed with low output.

Moreover, the beam scanning unit 32 configured to scan the laser beam 50 is disposed such that the machining line 52 can be formed perpendicularly to the feeding direction Y of the work 5, and such that high-speed continuous machining can be performed. This makes it possible not only to perform machining on the work 5 for each substrate, but also to perform high-speed continuous machining on a continuous workpiece in a roll-to-roll process in the production of a flexible solar cell.

Figure 11A:
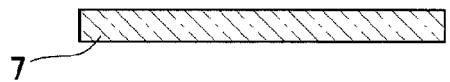
FIG. 11A is a side cross-sectional view showing the steps of producing a solar cell by the laser machining device shown in FIG. 1, the side cross-sectional view showing a glass substrate prior to forming a thin-film layer on the glass substrate.
Figure 11B:
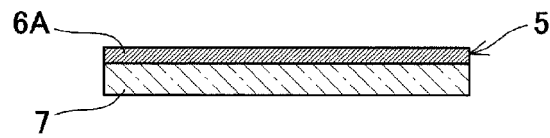
FIG. 11B is a side cross-sectional view showing the steps of producing the solar cell by the laser machining device shown in FIG. 1, and is a side cross-sectional view of work showing a process of forming a transparent electrode layer on the glass substrate shown in FIG. 11A.
Figure 11C:
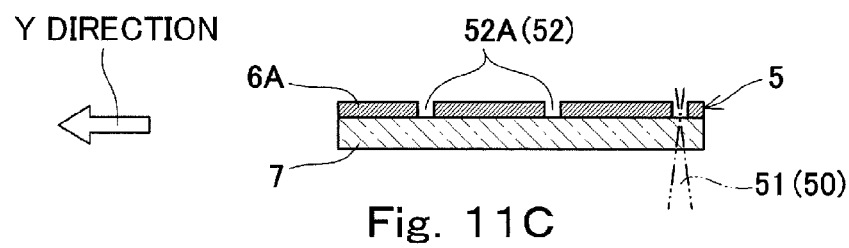
FIG. 11C is a side cross-sectional view showing the steps of producing the solar cell by the laser machining device shown in FIG. 1, and is a side cross-sectional view of the work showing a process of forming machining lines in the work shown in FIG. 11B.
Figure 11D:
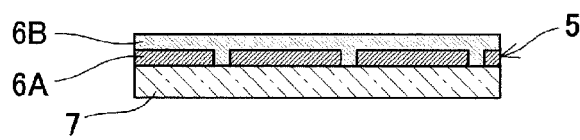
FIG. 11D is a side cross-sectional view showing the steps of producing the solar cell by the laser machining device shown in FIG. 1, and is a side cross-sectional view of the work showing a process of forming a photoelectric conversion layer after the formation of the machining lines shown in FIG. 11C.
Figure 11E:
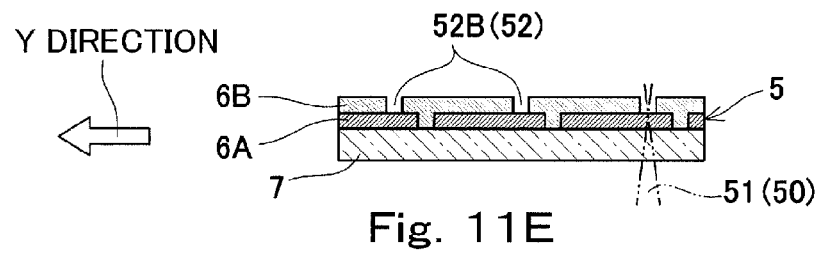
FIG. 11E is a side cross-sectional view showing the steps of producing the solar cell by the laser machining device shown in FIG. 1, and is a side cross-sectional view of the work showing a process of forming machining lines in the work shown in FIG. 11D.
Figure 11F:
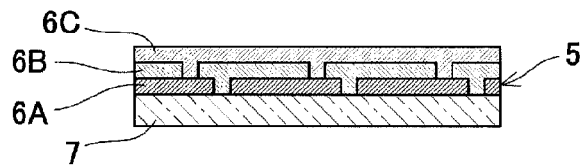
FIG. 11F is a side cross-sectional view showing the steps of producing the solar cell by the laser machining device shown in FIG. 1, and is a side cross-sectional view of the work showing a process of forming a back surface electrode layer after the formation of the machining lines shown in FIG. 11E.
Figure 11G:
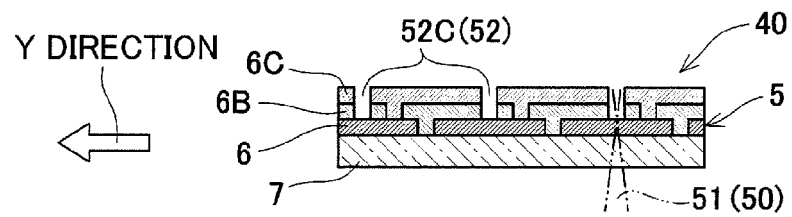
FIG. 11G is a side cross-sectional view showing the steps of producing the solar cell by the laser machining device shown in FIG. 1, and is a side cross-sectional view of the work showing a process of forming machining lines in the work shown in FIG. 11F.

FIGS. 11A to 11G are side cross-sectional views showing solar cell production steps by the laser machining device shown in FIG. 1. Hereinafter, typical production steps of a thin film type solar cell 40 by the laser machining device 1 having the above configuration are described. First, as shown in FIG. 11B, a transparent electrode layer 6A is formed on the substrate 7 shown in FIG. 11A. Next, as shown in FIG. 11C, machining lines 52A are formed in the transparent electrode layer 6A. The machining lines 52A are formed by scanning the laser beam 50 in the scanning direction X at a constant speed while feeding the work 5 in the feeding direction Y at a constant speed. Then, as shown in FIG. 11D, a photoelectric conversion layer 6B is formed on the work 5 which has gone through the formation of the machining lines 52A in the transparent electrode layer 6A. Thereafter, as shown in FIG. 11E, machining lines 52B are formed in the photoelectric conversion layer 6B in a manner similar to the above-described formation of the machining lines 52A by the laser machining device 1. In the formation of the machining lines 52B, since the focal length of the laser machining device 1 corresponds to the photoelectric conversion layer 6B, the photoelectric conversion layer 6B comes off in such a manner that a predetermined machining line 52B is formed in the photoelectric conversion layer 6B. After the formation of the machining lines 52B in the photoelectric conversion layer 6B, a back surface electrode layer 6C is formed as shown in FIG. 11F. As shown in FIG. 11G, machining lines 52C are formed in the back surface electrode layer 6C by a laser machining device 1 for use in the back surface electrode layer formation with a machining method similar to one used for forming the above machining lines 52A and 52B. In this manner, the solar cell 40 is fabricated as a solar cell module.

As described above, in the case of forming the machining lines 52A-C in the multi-film layers, the laser machining device 1 can form the machining lines 52A-C at a high speed in the X direction crossing the feeding direction (Y direction) of the work 5 while feeding the work 5 in the feeding direction. Therefore, patterning of the machining lines 52A-C can be continuously performed without stopping the feeding of the work 5.

As a result, the takt time of the work for forming the machining lines 52A to 52C in the work 5 can be greatly reduced, and the productivity of for example, solar cell production can be improved significantly. Consequently, the cost of the solar cell 40 can be reduced, which makes it possible to promote the use of solar cells. Moreover, according to the above-described laser machining device 1 of the present embodiment, the linear machining lines 52A to 52C can be formed with a high precision. This makes it possible to stably fabricate the solar cell 40 which realizes highly efficient power generation owing to its increased power generation area. Furthermore, use of a plurality of beams obtained by a spectrometer and a plurality of oscillators is eliminated, and therefore, the cost of the laser machining device 1 capable of fabricating the solar cell 40 with stable machining quality can be reduced.

Although the above embodiment describes an example in which the work 5 is continuously moved in the feeding direction Y at a constant speed, the present embodiment is not limited to the above example, Alternatively, the work 5 may be moved intermittently at regular intervals in accordance with, for example, machining conditions. The above-described embodiment merely indicates one example. Various changes may be made without departing from the spirit of the present invention. Thus, the present invention is not limited to the above-described embodiment.

INDUSTRIAL APPLICABILITY

The present invention makes it possible to scan a laser beam at a constant speed while maintaining the laser beam in a focused state and performing a deflecting operation at a constant speed. Further, the present invention provides a special functional advantage that an optical scanning device configured to scan light such as a laser beam can be readily produced and the size of the device can be readily increased. The present invention is applicable to various optical scanning. The present invention is particularly useful when applied in the production of a thin film type solar cell such as a thin-film solar cell or a flexible solar cell.

REFERENCE SIGNS LIST 1 laser machining device
3 feeder
5 work
30 laser beam unit
31 laser oscillator
32 beam scanning unit
50 laser beam
51 pulse laser beam
52 scanning line
52A to 52C machining line
60 controller
65 light projector
66 light reflector
67 cylindrical lens
68 deflection actuator
69 casing
70 polygon mirror
71 primary reflecting portion
72 secondary reflecting portion
73 primary mirror
74 secondary mirror
C deflection center
VA virtual arc
DVA1, DVA2, . . . divided virtual arc
VC1, VC2, . . . virtual chord
VC1', VC2', . . . rearranged virtual chord
DVA1', DVA2', . . . rearranged divided virtual arc

The invention claimed is:

1. A laser machining device configured to form a machining line with a laser beam in a thin-film layer formed on work, the laser machining device comprising:
   an optical scanning device configured to scan light as the laser beam along a predetermined scanning line on the work, the optical scanning device comprising:
      a light projector configured to radiate light while causing the light to make angular movement at a constant speed; and
      a light reflector configured to reflect the light radiated from the light projector to guide the light to an intended irradiated point on the predetermined scanning line, wherein
   the light reflector includes a plurality of reflecting portions and reflects, at least twice, the light radiated from the light projector to guide the light to the intended irradiated point, each of the reflecting portions including a plurality of reflecting surfaces that are flat surfaces,
   the plurality of reflecting portions reflect the light radiated from the light projector at least twice such that a plurality of virtual chords respectively corresponding to a plurality of divided virtual arcs, which are obtained by dividing a virtual arc in a circumferential direction, are rearranged such that the plurality of virtual chords are sequentially continuous and linearly aligned to form the scanning line,
   the virtual arc is an arc drawn by a focal point of the light radiated from the light projector when it is assumed that the light reflector is absent, the arc having a center coinciding with a center of the angular movement,
   the plurality of reflecting surfaces of each reflecting portion correspond to the plurality of divided virtual arcs, respectively, and
   a length of an optical path from the light projector to the irradiated point is substantially constant for all of irradiated points on the scanning line, and a scanning speed, on the scanning line, of the light radiated from the light projector is substantially constant.

2. The laser machining device according to claim 1, wherein the light projector includes a rotating multifaceted mirror configured to rotate at a constant speed.

3. The laser machining device according to claim 2, wherein the rotating multifaceted mirror includes seven or more reflecting surfaces.

4. The laser machining device according to claim 1, wherein the scanning line is a straight line.

5. The laser machining device according to claim 1, wherein the light projector radiates a pulse laser beam.

6. The laser machining device according to claim 5, further comprising a cylindrical lens configured to flatten the pulse laser beam.

7. The laser machining device according to claim 1, comprising:
   a constant-speed feeder configured to feed the work in a single feeding direction at a predetermined feeding speed;
   a work position maintaining mechanism configured to support the work at a proper position in a machining part configured to form the machining line in the work with the laser beam; and
   a controller configured to control the optical scanning device and the constant-speed feeder, wherein
   the optical scanning device radiates a laser beam to the work fed by the constant-speed feeder, the laser beam being radiated in a direction crossing the feeding direction, and
   the controller causes the optical scanning device to scan a single laser beam in the direction crossing the feeding direction of the work while causing the constant-speed feeder to feed the work at the predetermined feeding speed or while causing the constant-speed feeder to feed the work at the same time as detecting a feeding speed of the work, and controls the feeding speed of the work in relation to a scanning speed of the single laser beam such that a machining line formed by the single laser beam is perpendicular to the feeding direction of the work fed at the predetermined feeding speed.

8. The laser machining device according to claim 7, wherein the constant-speed feeder has a twisting correction function of adjusting a planar-direction relative angle between the work fed in the single feeding direction and the laser beam.

9. The laser machining device according to claim 7, wherein the laser beam is a flat beam that is long in a scanning direction.

10. The laser machining device according to claim 7, wherein the work is a glass substrate having a thin-film layer formed thereon, and the laser beam is a transmissive laser beam, and the laser machining device is configured to radiate the transmissive laser beam to the glass substrate from an opposite side to the thin-film layer side to form a machining line in the thin-film layer.

11. The laser machining device according to claim 7, wherein the work position maintaining mechanism includes:
a work supporting mechanism provided below the work and configured to feed the work with the thin-film layer facing upward; and
a non-contact work pushing mechanism provided above the work.

12. The laser machining device according to claim 7, comprising a removed film suction device disposed at the thin-film layer side of the work.

* * * * *